(12) United States Patent
Seki et al.

(10) Patent No.: US 7,564,288 B2
(45) Date of Patent: *Jul. 21, 2009

(54) SEMICONDUCTOR INTEGRATED CIRCUIT

(75) Inventors: Hiroshi Seki, Suwa (JP); Hiroshi Tokiwai, Chino (JP)

(73) Assignee: Seiko Epson Corporation (JP)

( * ) Notice: Subject to any disclaimer, the term of this patent is extended or adjusted under 35 U.S.C. 154(b) by 153 days.

This patent is subject to a terminal disclaimer.

(21) Appl. No.: 11/423,518

(22) Filed: Jun. 12, 2006

(65) Prior Publication Data

US 2006/0279346 A1    Dec. 14, 2006

(30) Foreign Application Priority Data

Jun. 13, 2005    (JP)    ............... 2005-171846

(51) Int. Cl.
    *H03L 5/00*    (2006.01)
(52) U.S. Cl. ................ 327/333; 326/63; 326/68; 326/80; 326/81; 326/82; 326/83
(58) Field of Classification Search .............. 327/333; 326/63, 68, 81, 82, 83, 80
    See application file for complete search history.

(56) References Cited

U.S. PATENT DOCUMENTS

| 5,473,496 | A | 12/1995 | Rouy | |
|---|---|---|---|---|
| 6,545,521 | B2* | 4/2003 | Dale et al. | 327/333 |
| 2005/0068062 | A1* | 3/2005 | Yamasaki et al. | 326/81 |
| 2006/0279347 | A1* | 12/2006 | Seki et al. | 327/333 |
| 2007/0008006 | A1* | 1/2007 | Na | 326/83 |
| 2007/0018710 | A1* | 1/2007 | Choi et al. | 327/333 |

FOREIGN PATENT DOCUMENTS

| JP | 6-236693 | 8/1994 |
|---|---|---|
| JP | 09-135160 | 5/1997 |
| JP | 2000-174610 | 6/2000 |
| JP | 2002-185299 | 6/2002 |
| JP | 2002-185307 | 6/2002 |
| JP | 2004-128590 | 4/2004 |
| JP | 2004-356779 | 12/2004 |

* cited by examiner (Continued)

*Primary Examiner*—Long Nguyen
*Assistant Examiner*—Brandon S Cole
(74) *Attorney, Agent, or Firm*—Harness, Dickey & Pierce, P.L.C.

(57) ABSTRACT

A semiconductor integrated circuit that operates upon supply of a plurality of power potentials including a first power potential and a second power potential higher than the first power potential, includes: an internal circuit that operates upon supply of the first power potential; an inverter that inverts an output signal of the internal circuit upon supply of the first power potential; a level shift circuit, which inputs the output signal of the internal circuit into a first input terminal while inputting the output signal of the inverter into a second input terminal, which generates, upon supply of the second power potential and at each of first and second output terminals, a level shift signal input into the first and second input terminals whose signal level has been shifted, and which outputs the level shift signal from one terminal out of the first and second output terminals; an output circuit that operates upon supply of the second power potential based on the level shift signal output from the level shift circuit; and a potential fixing circuit that fixes potentials in the first and second input terminals or potentials in one out of the first and second input terminals and one out of the first and second output terminals of the level shift circuit when the second power potential is supplied and the first power potential is not supplied.

9 Claims, 6 Drawing Sheets

US 7,564,288 B2

SEMICONDUCTOR INTEGRATED CIRCUIT

BACKGROUND

1. Technical Field

The present invention relates generally to a semiconductor integrated circuit such as IC and LSI and particularly to a semiconductor integrated circuit that operates upon supply of a plurality of power potentials.

2. Related Art

In order to realize high-speed and low-electricity operation of various types of electronic apparatuses such as an IC and an LSI, semiconductor integrated circuits used in these electronic apparatuses are becoming more highly integrated and operating on more reduced voltages. However, it is extremely difficult to reduce operation voltages in all semiconductor integrated circuits in view of device-specific characteristics. Therefore, a situation occurs in which a plurality of semiconductor integrated circuits that operate on different power potentials become coupled to each other.

To cope with such a situation, a semiconductor integrated circuit having an internal circuit that operates upon supply of a low power potential and an output circuit that operates upon supply of a high power potential has been developed. An example of such a semiconductor integrated circuit operating upon supply of two kinds of power potentials will be explained with reference to FIG. 6.

The semiconductor integrated circuit shown in FIG. 6 contains: an internal circuit 10 that operates upon supply of a first power potential $LV_{DD}$ (e.g., 1.8V); an inverter 20 that inverts an output signal of the internal circuit 10 upon supply of the first power potential $LV_{DD}$; a level shift circuit 30, which inputs the output signal of the internal circuit 10 into a first input terminal (a node A) while inputting the output signal of the inverter 20 into a second input terminal (a node B), which generates, upon supply of the second power potential $HV_{DD}$ (e.g., 3.3V) and at each of first and second output terminals (nodes C and D), the input level shift signal whose level has been shifted, and which outputs the level shift signal from the second output terminal (the node D); and an output circuit (an inverter 40 in this case) that operates upon supply of the second power potential $LV_{DD}$.

The level shift circuit 30 is composed of: a P-channel MOS transistor QP1 and an N-channel MOS transistor QN1 connected in series, whose gates receive the output signal of the internal circuit 10; a P-channel MOS transistor QP2 and an N-channel MOS transistor QN2 connected in series, whose gates receive the output signal of the inverter 20; a P-channel MOS transistor QP3 that supplies current to the transistors QP1 and QN1; and a fourth P-channel MOS transistor QP4 that supplies current to the transistors QP2 and QN2.

By shifting the level of the input signal, the level shift circuit 30 generates the level shift signal having a level suitable for the inverter 40 that operates upon supply of the power potential $HV_{DD}$. After being inverted by the inverter 40, this level shift signal is supplied via an output pad to an external circuit that operates on the power potential $HV_{DD}$ or higher than the power potential $HV_{DD}$.

With such a semiconductor integrated circuit, there is a case in which the second power potential $HV_{DD}$ is supplied even when the first power potential $LV_{DD}$ is not supplied for a reason such as that the external circuit connected to the output pad is operating. In such a case, an output of the internal circuit 10 and the inverter 20 becomes a high impedance state (the potential is unstable), and a through current $I_1$ may flow via the transistors QP3, QP1, and QN1 depending on the potentials of the nodes A and B. Further, depending on the potentials of the nodes A and B, a through current $I_2$ may flow via the transistors QP4, QP2, and QN2.

As a related technique, JP-A-06-236693 discloses a device for protecting an integrated circuit so that random storage and erase of data is prevented from unwanted or unexpected cut off of power. This device is equipped with: a voltage source that generates a programming/erasure voltage Vpp; cut-off means connected in series between the voltage source and a supply input of the integrated circuit corresponding to this voltage source; and means to activate the cut-off means, connected to the voltage source that generates a normal supply voltage Vcc. This cut-off means is activated when the voltage Vcc falls below a certain threshold voltage and protects the data from being rewritten or erased. However, JP-A-06-236693 does not mention on prevention against the through current flowing to the level shift circuit when only one out of the two kinds of power potentials is being supplied.

SUMMARY OF THE INVENTION

An advantage of the invention is to provide a semiconductor integrated circuit that operates upon supply of a plurality of power potentials, by which through current is prevented from flowing to a level shift circuit when only one out of two kinds of power potentials is being supplied.

According to one aspect of the invention, a semiconductor integrated circuit, which operates upon supply of a plurality of power potentials including a first power potential and a second power potential higher than the first power potential, includes: an internal circuit that operates upon supply of the first power potential; an inverter that inverts an output signal of the internal circuit upon supply of the first power potential; a level shift circuit, which inputs the output signal of the internal circuit into a first input terminal while inputting the output signal of the inverter into a second input terminal which generates, upon supply of the second power potential and at each of first and second output terminals, a level shift signal input into the first and second input terminals whose signal level has been shifted, and which outputs the level shift signal from one terminal out of the first and second output terminals; an output circuit that operates upon supply of the second power potential based on the level shift signal output from the level shift circuit; and a potential fixing circuit that fixes potentials in the first and second input terminals or potentials in one out of the first and second input terminals and one out of the first and second output terminals of the level shift circuit when the second power potential is supplied and the first power potential is not supplied.

In this case, the level shift circuit may include: a first P-channel MOS transistor and a first N-channel MOS transistor connected in series, whose gates receive an output signal of the internal circuit; a second P-channel MOS transistor and a second N-channel MOS transistor connected in series, whose gates receive an output signal of the inverter; a third P-channel MOS transistor that supplies current to the first P-channel MOS transistor and the first N-channel MOS transistor; and a fourth P-channel MOS transistor that supplies current to the second P-channel MOS transistor and a second N-channel MOS transistor.

In this case, the potential fixing circuit may fix gate potentials of the first P-channel MOS transistor and the first N-channel MOS transistor at low level and fixes drain potentials of the second P-channel MOS transistor and the second N-channel MOS transistor at low level when the second power potential is supplied and the first power potential is not supplied. Further, the potential fixing circuit may fix gate potentials of the second P-channel MOS transistor and the second N-channel MOS transistor at low level and fixes drain potentials of the first P-channel MOS transistor and the first N-channel MOS transistor at low level when the second power potential is supplied and the first power potential is not supplied.

According to another aspect of the invention, a semiconductor integrated circuit, which operates upon supply of a plurality of power potentials including a first power potential and a second power potential higher than the first power potential, includes: an internal circuit that operates upon supply of the first power potential; a first level shift circuit, which inputs an output signal of the internal circuit into a first input terminal while inputting an inverted output signal into a second input terminal, which generates, upon supply of the second power potential and at each of first and second output terminals, a level shift signal input into each of the first and second input terminals whose signal level has been shifted, and which outputs the level shift signal from one terminal out of the first and second output terminals; a second level shift circuit, which inputs an output signal of the internal circuit into a first input terminal while inputting an inverted output signal into a second input terminal, which generates, upon supply of the second power potential and at each of first and second output terminals, a level shift signal input into each of the first and second input terminals whose signal level has been shifted, and which outputs the level shift signal from one terminal out of the first and second output terminals; an output driver including a P-channel MOS transistor and an N-channel MOS transistor connected in series which generate, upon supply of a second power potential, an output signal based on the level shift signal output from each of the first and second level shift circuits; and a potential fixing circuit that fixes potentials in the first and second input terminals or potentials in one out of the first and second input terminals and one out of the first and second output terminals of the first and second level shift circuits when the second power potential is supplied and the first power potential is not supplied.

According to the aspects of the invention having structures as described, the through current may be prevented from flowing to the level shift circuit when only one out of the two kinds of power potentials is being supplied, by providing the potential fixing circuit that fixes potentials of two input terminals or potentials of one input terminal and one output terminal of the level shift circuit when the first power potential is not supplied.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described in detail with reference to the drawings. The same elements are allotted the same reference numbers, and their descriptions will not be repeated.

Figure 1:
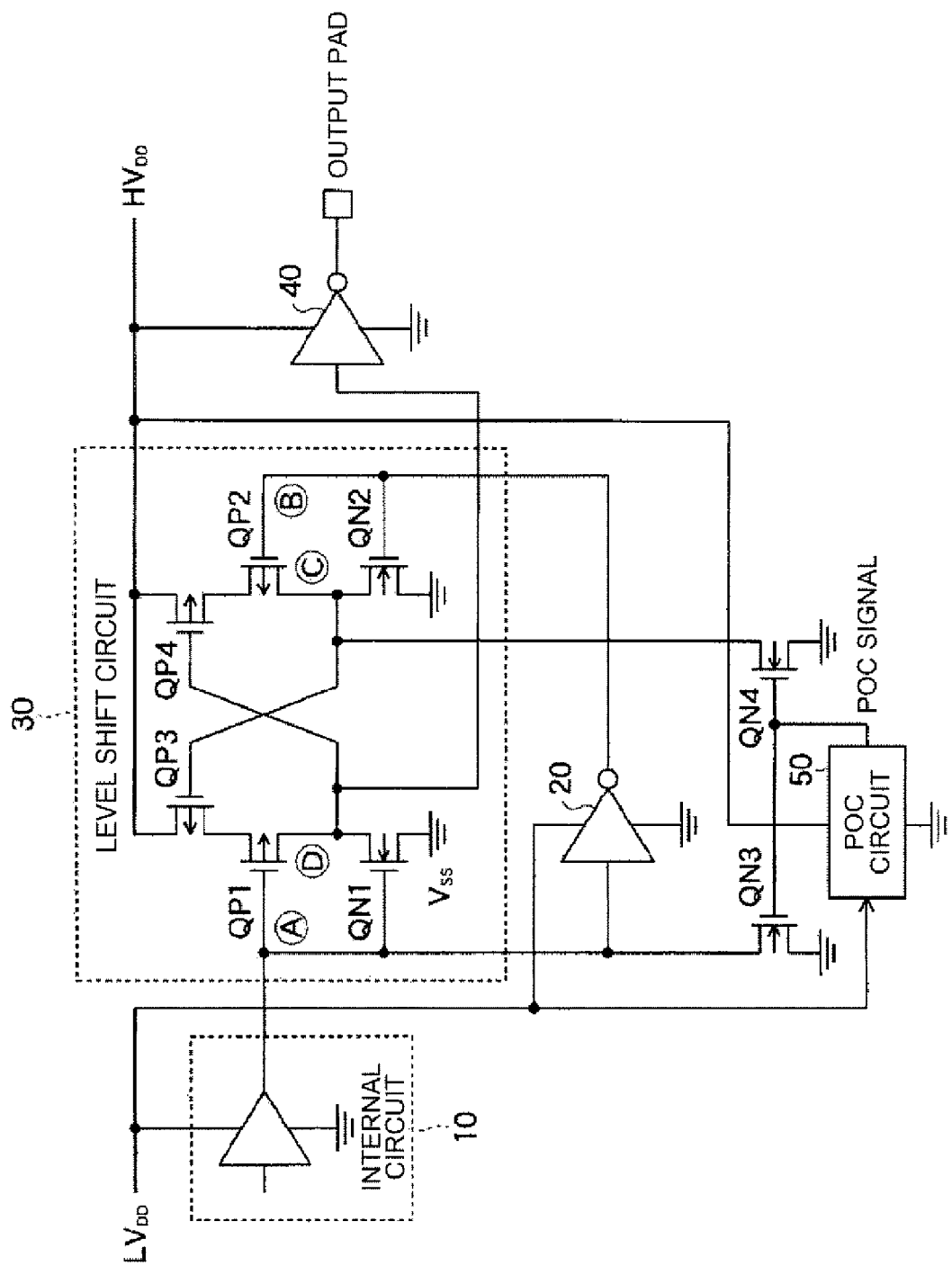
FIG. 1 is a diagram showing the structure of a semiconductor integrated circuit according to a first embodiment of the invention.

FIG. 1 is a diagram showing the structure of the semiconductor integrated circuit according to the first embodiment of the invention. This semiconductor integrated circuit operates upon supply of a first power potential $LV_{DD}$ (e.g., 1.8V), a second power potential $HV_{DD}$ (e.g., 3.3V) higher than the first power potential, and a reference potential $V_{SS}$ (a ground potential 0V).

As shown in FIG. 1, the semiconductor integrated circuit includes an internal circuit 10 that operates upon supply of the power potential $LV_{DD}$; an inverter 20 that inverts an output signal of the internal circuit 10 upon supply of the power potential $LV_{DD}$; a level shift circuit 30, which inputs an output signal of the internal circuit 10 into a first input terminal (a node A) while inputting an output signal of the inverter 20 into a second input terminal (a node B), which generates, upon supply of the power potential $HV_{DD}$ and at each of first and second output terminals (nodes C and D), the level shift signal input into each of the first and second input terminals whose signal level has been shifted, and which outputs the level shift signal from one terminal out of the first and second output terminals (in the present embodiment, the second output terminal); and an output circuit (in the embodiment, an output inverter 40) that operates upon supply of the power potential $HV_{DD}$ based on the level shift signal output from the level shift circuit 30.

The level shift circuit 30 is composed of: a P-channel MOS transistor QP1 and an N-channel MOS transistor QN1 connected in series, whose gates receive an output signal of the internal circuit 10; a P-channel MOS transistor QP2 and an N-channel MOS transistor QN2 connected in series, whose gates receive an output signal of the inverter 20; a P-channel MOS transistor QP3 that supplies current to the transistors QP1 and QN1; and a fourth P-channel MOS transistor QP4 that supplies current to the transistors QP2 and QN2.

When the output signal of the internal circuit 10 and the inverter 20 is input into each of the first and second input terminals (the nodes A and B) of the level shift circuit 30, the level shift circuit 30 generates the input level shift signal whose level has been shifted, and supplies it to the first and second output terminals (the nodes C and D). In the embodiment, the level shift signal of the second output terminal (the node D), out of these two output terminals, is output to the inverter 40 and, after being inverted by the inverter 40, output to the external circuit that operates on the power potential $HV_{DD}$ or higher than that via an output pad.

With such a semiconductor integrated circuit, there is a case in which the power potential $HV_{DD}$ is supplied even when the power potential $LV_{DD}$ is not supplied for a reason such as that the external circuit connected to the output pad is operating. In such a case, the output of the internal circuit 10 and the inverter 20 becomes a high impedance state (the potential is unstable), and the through current may flow via the transistors QP3, QP1, and QN1 depending on the potentials of the nodes A and B. Further, depending on the potentials of the nodes A and B, the through current may flow via the transistors QP4, QP2, and QN2.

Therefore, in the embodiments of the invention, the through current in the level shift 30 is prevented by providing the potential fixing circuit that fixes potentials in the first and second input terminals or potentials in one out of the first and second input terminals and one out of the first and second output terminals of the level shift circuit 30 when the power potential $HV_{DD}$ is supplied and the $LV_{DD}$ power potential is not supplied.

In the first embodiment, a power-on-control (POC) circuit 50 and the N-channel MOS transistors QN3 and QN4 are provided as the potential fixing circuit. Upon supply of the power potential $HV_{DD}$, the POC circuit 50 detects whether or not the power potential $LV_{DD}$ is supplied, outputs a high level POC signal if the power potential $LV_{DD}$ is not supplied, and outputs a low level POC signal if the power potential $LV_{DD}$ is supplied. The POC signal that is output from the POC circuit 50 is supplied to the gates of the transistors QN3 and QN4.

The drain of the transistor QN3 is coupled to the first input terminal (the node A) of the level shift circuit 30, and the source is coupled to the reference potential $V_{SS}$. Further, the drain of the transistor QN4 is coupled to the first output terminal (the node C) of the level shift circuit 30, and the source is coupled to the reference potential $V_{SS}$.

Thus, when the power potential $HV_{DD}$ is supplied and the power potential $LV_{DD}$ is not supplied, the transistor QN3 fixes the potential of the first input terminal (the node A) at low level, while the transistor QN4 fixes the potential of the first output terminal (the node C) at low level.

When the potentials of the nodes A and C become low level, the transistors QP3 and QP1 become an on state, and the transistor QN1 becomes an off state. Further, the potential of the node D becomes high level, and the transistor QP4 is cut off. Accordingly, when the power potential $HV_{DD}$ is supplied and the power potential $LV_{DD}$ is not supplied, the through current in the level shift circuit 30 can be prevented.

Furthermore, because the potential of the node D is fixed at high level, the through current at the inverter 40 can be prevented. Further, if the level shift signal that is output to the inverter 40 is taken from the first output terminal (the node C) of the level shift circuit 30, the potential of the second input terminal (the node B) as well as the potential of the second output terminal (the node D) may be fixed.

Figure 2:
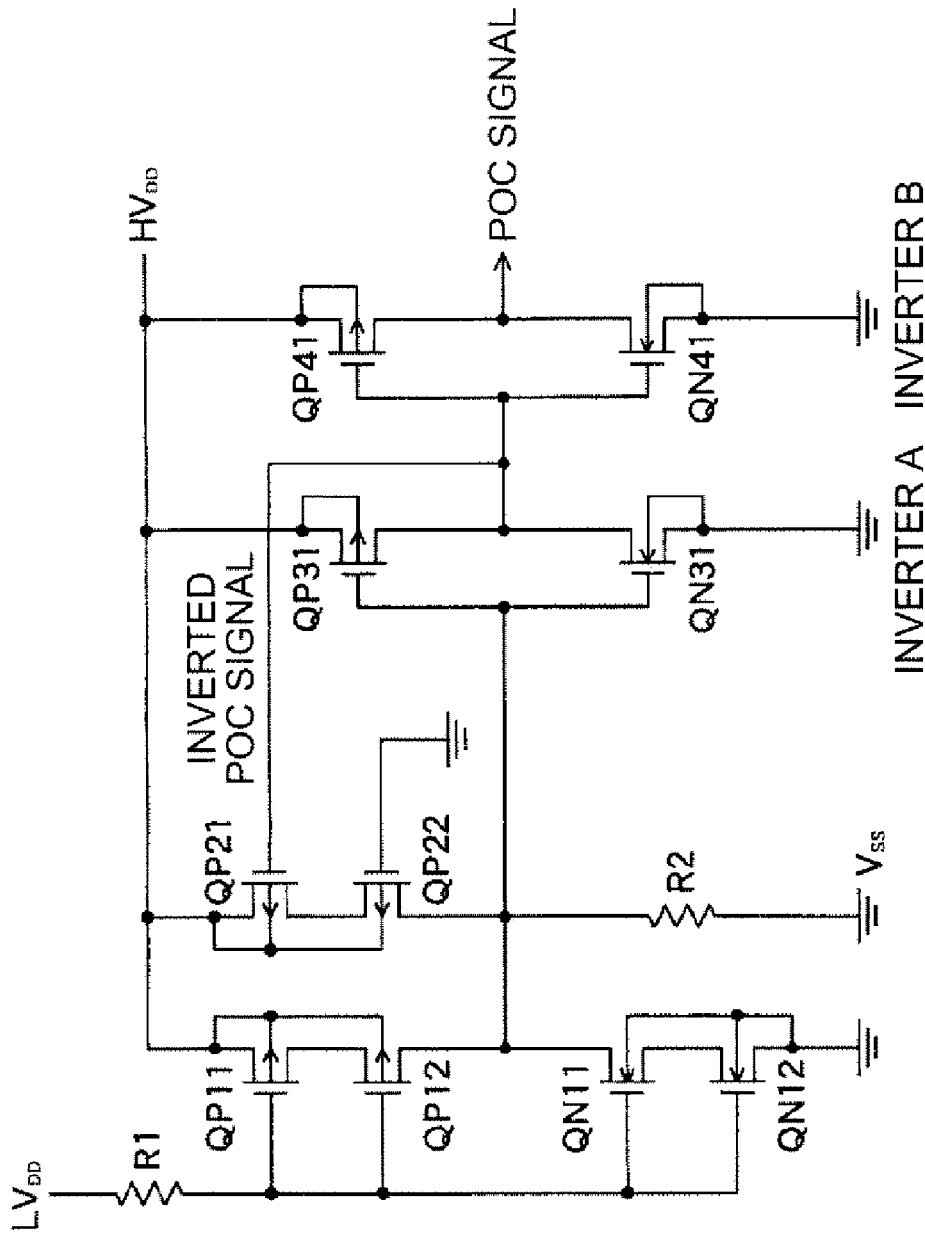
FIG. 2 is a circuitry diagram showing the structure of a POC circuit used in the embodiments of the invention.

FIG. 2 is a circuitry diagram showing the structure of the POC circuit used in the embodiment of the invention. The POC circuit 50 includes: a resistor R1 coupled to the power potential $LV_{DD}$; P-channel MOS transistors QP11 and QP12 and N-channel MOS transistors QN11 and QN12 connected in series; P-channel MOS transistors QP21 and QP22 and a resistor R2 connected in series; a P-channel MOS transistor QP31 and a P-channel MOS transistor QN31 constituting an inverter A; and a P-channel MOS transistor QP41 and an N-channel MOS transistor QN41 constituting an inverter B.

Since the power potential $LV_{DD}$ becomes low level when the power potential $LV_{DD}$ is not supplied, the transistors QP11 and QP12 turn on, and the transistors QN11 and QN12 turn off Therefore, the inverter A that has received a high-level signal outputs a low-level inverted POC signal, and the inverter B that has received the low-level inverted POC signal outputs a high-level inverted POC signal. The inverted POC signal is fed back positively to the transistor QS21, thereby further stabilizing this state. In contrast, when the power potential $LV_{DD}$ is supplied, the level relationship at each section is reversed, and, thereby, the inverter A outputs the high-level inverted POC signal, and the inverter B outputs the low-level POC signal.

The second embodiment of the invention will now be described.

Figure 3:
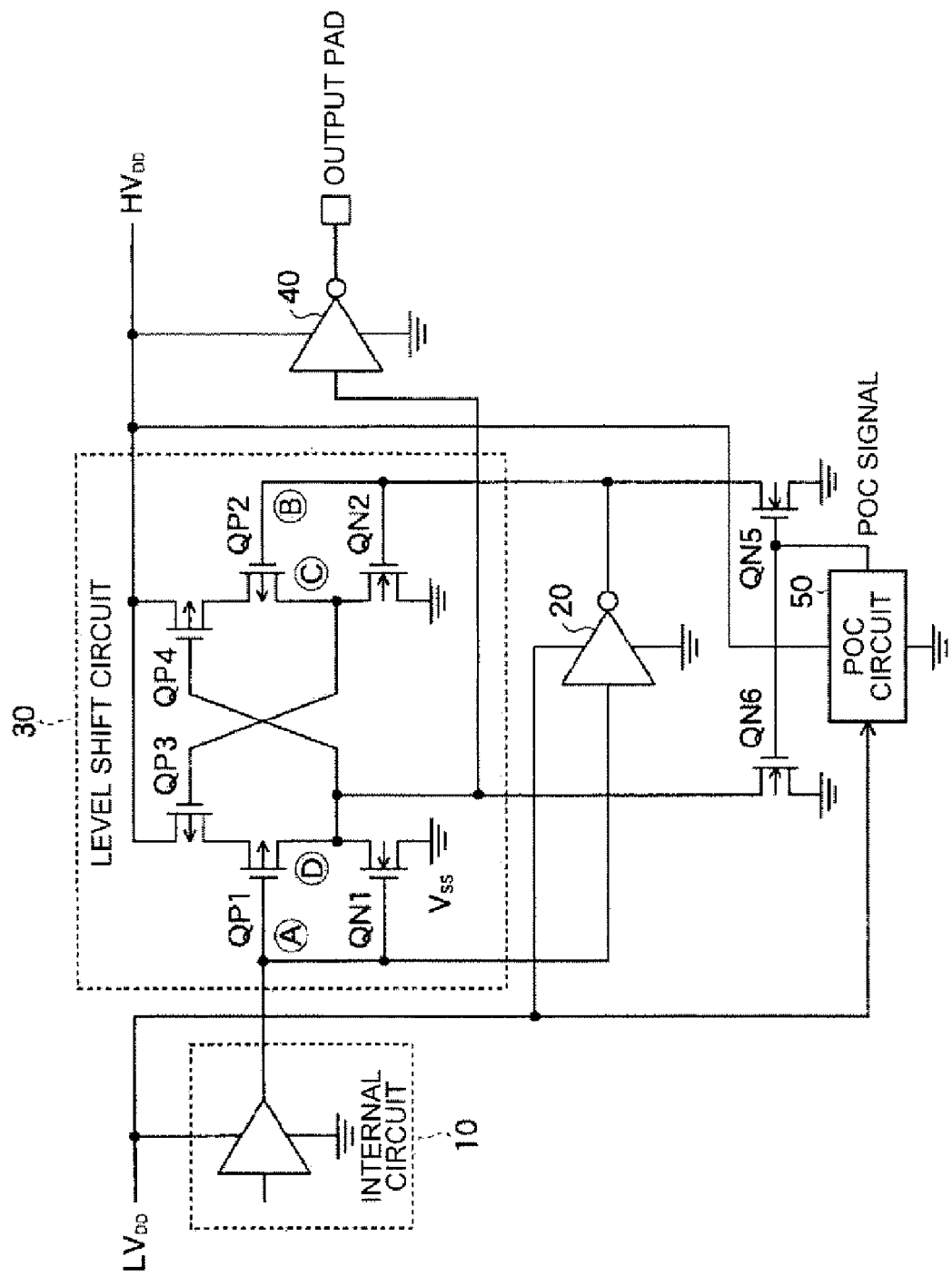
FIG. 3 is a diagram showing the structure of a semiconductor integrated circuit according to a second embodiment of the invention.

FIG. 3 is a diagram showing the structure of the semiconductor integrated circuit according to the second embodiment of the invention. In the second embodiment, the POC circuit 50 and N-channel MOS transistors QN5 and QN6 are provided as the potential fixing circuit. The POC signal that is output from the POC circuit 50 is supplied to the gates of the transistors QN5 and QN6.

The drain of the transistor QN5 is coupled to the second input terminal (the node B) of the level shift circuit 30, and the source is coupled to the reference potential $V_{SS}$. Further, the drain of the transistor QN6 is coupled to the second output terminal (the node D) of the level shift circuit 30 and the source is coupled to the reference potential $V_{SS}$.

Thus, when the power potential $HV_{DD}$ is supplied and the power potential $LV_{DD}$ is not supplied, the transistor QN5 fixes the potential of the second input terminal (the node B) at low level, while the transistor QN6 fixes the potential of the second output terminal (the node D) at low level.

Because the potentials of the nodes B and D become low level, the transistors QP4 and QP2 become the on state, and the transistor QN2 becomes the off state. Further, the potential of the node C becomes high level, and the transistor QP3 is cut off. Accordingly, when the power potential $HV_{DD}$ is supplied and the power potential $LV_{DD}$ is not supplied, the through current in the level shift circuit 30 can be prevented.

Furthermore, because the potential of the node D is fixed at low level, the through current at the inverter 40 can be prevented. In addition, if the level shift signal that is output to the inverter 40 is taken from the first output terminal (the node C) of the level shift circuit 30, the potential of the first input terminal (the node A) as well as the potential of the first output terminal (the node C) may be fixed.

The third embodiment of the invention will now be described.

Figure 4:
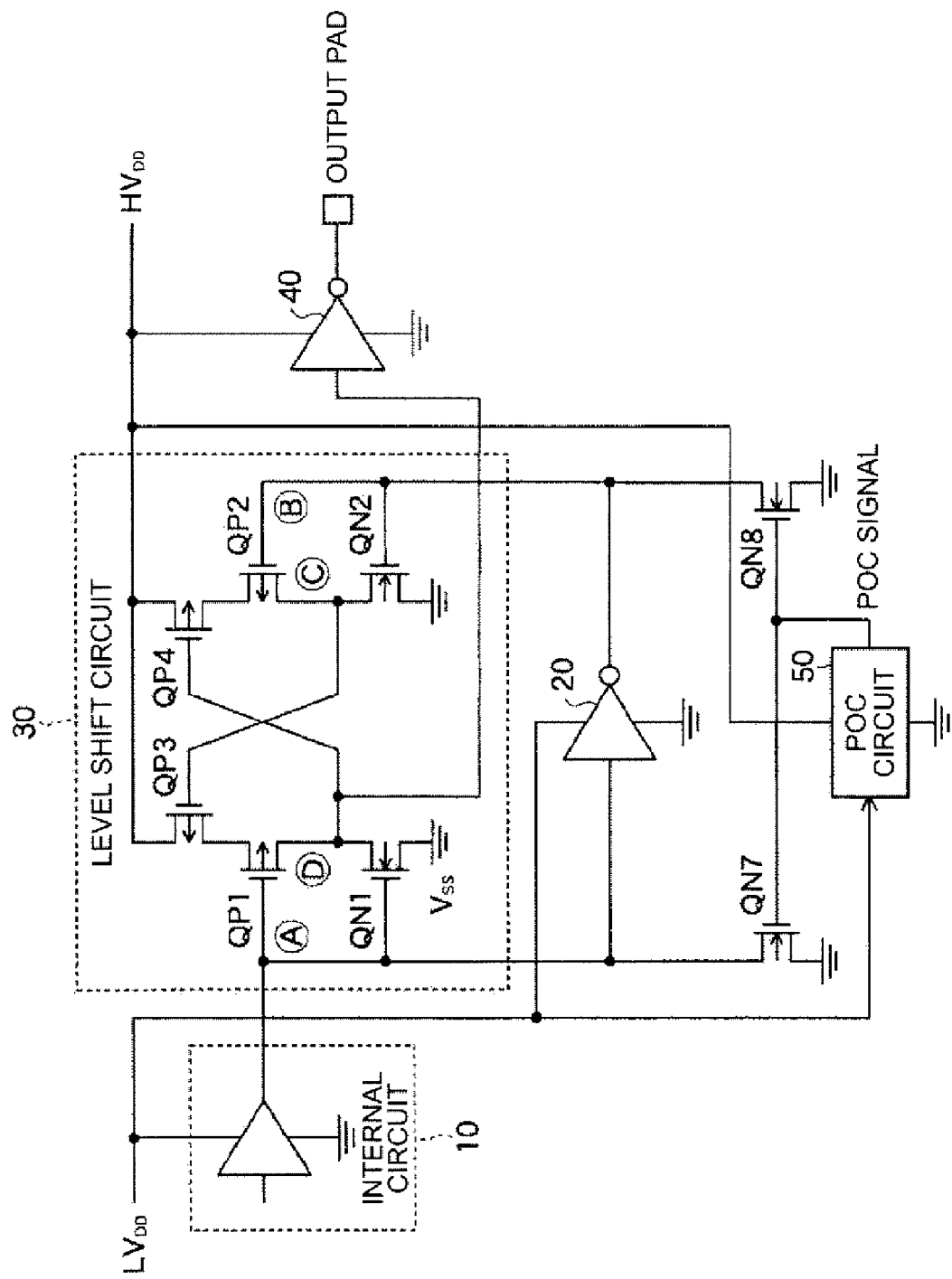
FIG. 4 is a diagram showing the structure of a semiconductor integrated circuit according to a third embodiment of the invention.

FIG. 4 is a diagram showing the structure of the semiconductor integrated circuit according to the third embodiment of the invention. In the third embodiment, the POC circuit 50 and N-channel MOS transistors QN7 and QN8 are provided as the potential fixing circuit. The POC signal that is output from the POC circuit 50 is supplied to the gates of the transistors QN7 and QN8.

The drain of the transistor QN7 is coupled to the first input terminal (the node A) of the level shift circuit 30, and the source is coupled to the reference potential $V_{SS}$. Further, the drain of the transistor QN8 is coupled to the second input terminal (the node B) of the level shift circuit 30, and the source is coupled to the reference potential $V_{SS}$.

Accordingly, when the power potential $HV_{DD}$ is supplied and the power potential $LV_{DD}$ is not supplied, the transistor QN7 fixes the potential of the first input terminal (the node A) at low level, while the transistor QN8 fixes the potential of the second input terminal (the node B) at low level.

When the potentials of the nodes A and B become low level, the transistors QP1 and QP2 are cut off. Accordingly, when the power potential $HV_{DD}$ is supplied and the power potential $LV_{DD}$ is not supplied, the through current in the level shift circuit 30 can be prevented.

The fourth embodiment of the invention will now be described.

Figure 5:
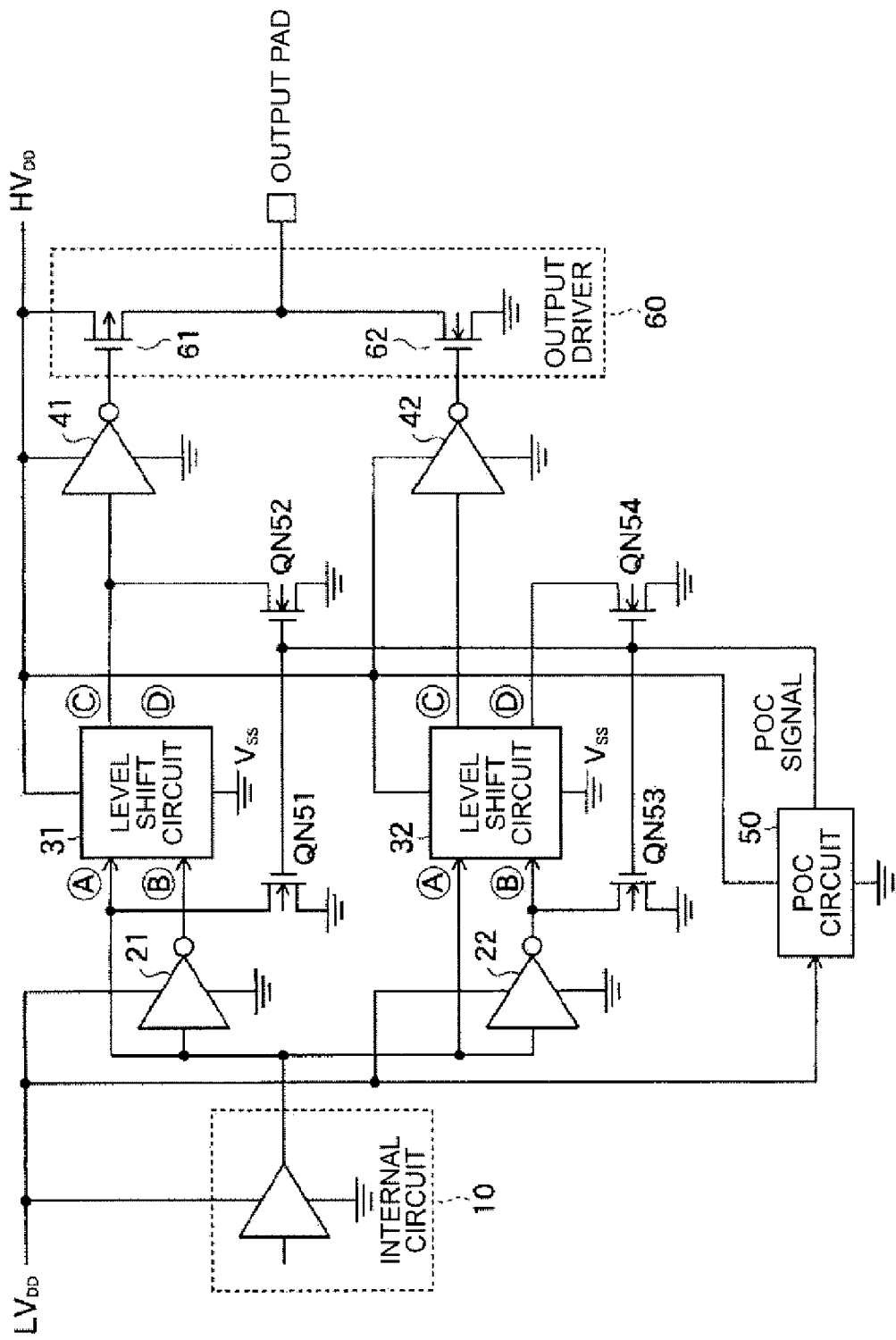
FIG. 5 is a diagram showing the structure of a semiconductor integrated circuit according to a fourth embodiment of the invention.
Figure 6:
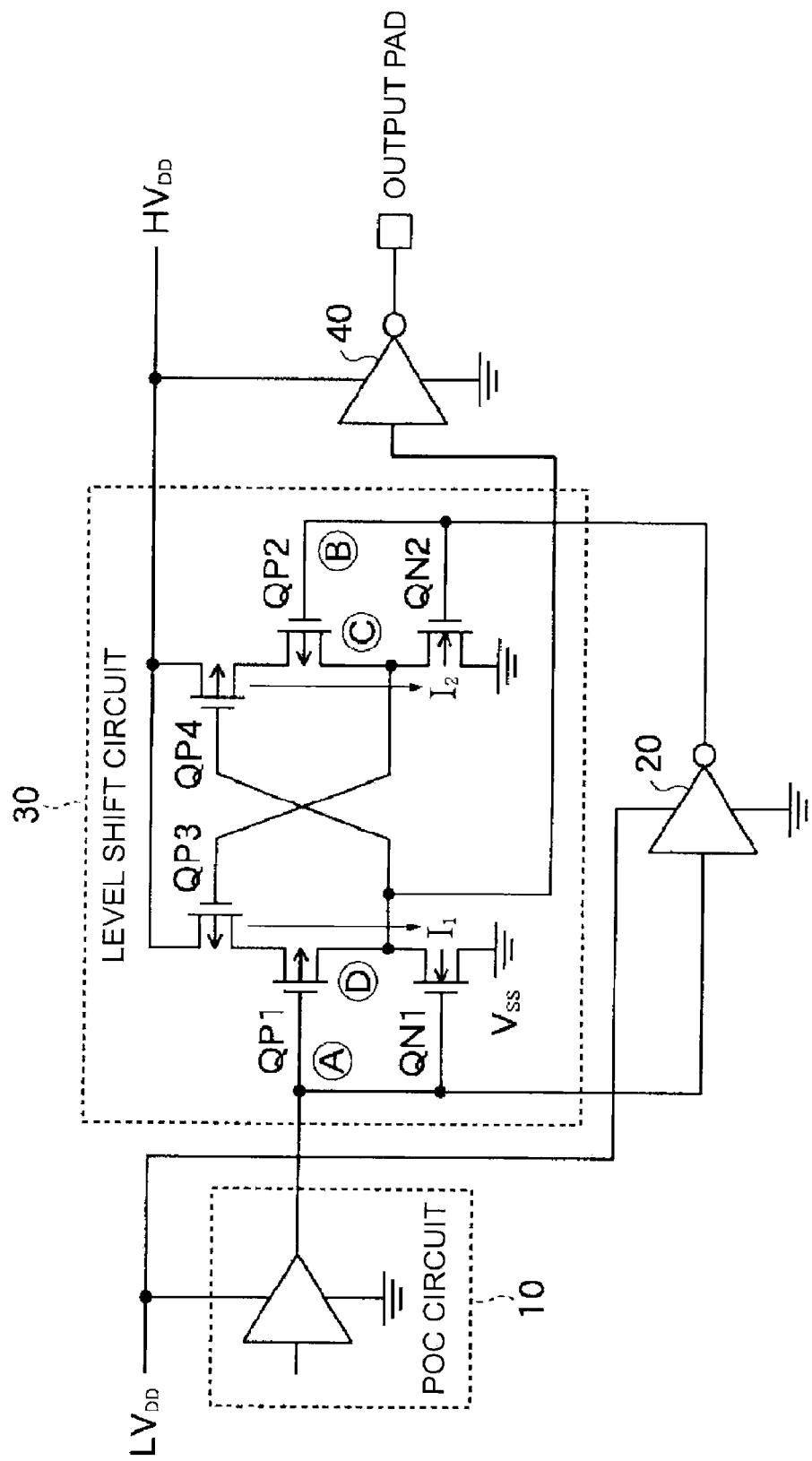
FIG. 6 is a diagram showing an example of a conventional semiconductor integrated circuit that operates upon supply of two kinds of power potentials.

FIG. 5 is a diagram showing the structure of the semiconductor integrated circuit according to the fourth embodiment of the invention. As shown in FIG. 5, this semiconductor integrated circuit includes an internal circuit 10 that operates upon supply of the power potential $LV_{DD}$; inverters 21 and 22 that invert an output signal of the internal circuit 10 upon supply of the power potential $LV_{DD}$; level shift circuits 31 and 32, which input the output signal of the internal circuit 10 into the first input terminals (the nodes A's) while inputting the output signal of the inverters 21 and 22 into the second input terminals (the nodes B's), which generate, upon supply of the power potential $HV_{DD}$ and at each of the first and second output terminals, the level shift signal input into each of the first and second output terminals whose signal level has been shifted, and which output the level shift signal from either the first or the second output terminal (in the present embodiment, the first output terminal: the node C); inverters 41 and 42 that each inverts the level shift signal output from the level shift circuits 31 and 32 upon supply of the power potential $HV_{DD}$; and an output driver 60.

In this case, the inverters 21 and 22 may be one common inverter. Also, the configuration of each of the level shift circuits 31 and 32 is identical to the configuration of the level shift circuit 30 shown in FIG. 1. The output driver 60 includes a P-channel MOS transistor 61 and an N-channel MOS transistor 62.

When the level shift circuits 31 and 32 receive the output signal from the internal circuit 10 while receiving an inverted output signal from the inverters 21 and 22 each of the level shift circuits 31 and 32 generates, by shifting the level of the received signal, a level shift signal having the level suitable for the inverters 41 and 42 which operate on the power potential $HV_{DD}$. After being inverted by the inverters 41 and 42, the level shift signal output from the drains of the transistors 61 and 62 is supplied via the output pad to the external circuit which operates on the power potential $HV_{DD}$ or on a power potential higher than that.

With such a semiconductor integrated circuit, there is a case in which the power potential $HV_{DD}$ is supplied even when the power potential $LV_{DD}$ is not supplied for a reason such as that the external circuit connected to the output pad is operating. In such a case, because the output of the internal circuit 10 and the inverters 21 and 22 becomes the high impedance state (the potential is unstable), the through current may flow to the level shift circuits 31 and 32 depending on the potentials of the nodes A and B. Further, if the output of the level shirt circuits 31 and 32 becomes unstable, both the transistors 61 and 62 constituting the output driver 60 become the on state, and the through current may flow to the output driver 60.

Therefore, in this embodiment, the POC circuit 50 and the N-channel MOS transistors QN51 through 54 are provided as the potential fixing circuit. Upon supply of the power potential $HV_{DD}$, the POC circuit 50 detects whether or not the power potential $LV_{DD}$ is being supplied, outputs a high level POC signal if the power potential $LV_{DD}$ is not supplied, and outputs a low level POC signal if the power potential $LV_{DD}$ is supplied. The POC signal output from the POC circuit 50 is supplied to the gates of the transistors QN51 through 54.

The drain of the transistor QN51 is coupled to the first input terminal (the node A) of a level shift circuit 31, and the source is coupled to the reference potential $V_{SS}$. Further, the drain of the transistor QN52 is coupled to the first output terminal (the node C) of the level shift circuit 31, and the source is coupled to the reference potential $V_{SS}$.

Thus, when the power potential $HV_{DD}$ is supplied and the power potential $LV_{DD}$ is not supplied, the transistor QN51 fixes the potential of the first input terminal (the node A) of the level shift circuit 31 at low level, while the transistor QN52 fixes the potential of the first output terminal (the node C) at low level.

When the potentials of the nodes A and C of the level shift circuit 31 become low level, the transistors QP3 and QP1 shown in FIG. 1 become the on state, and the transistor QN1 becomes the on state. Further, the potential of the node D becomes high level, and the transistor QP4 is cut off. Accordingly, when the power potential $HV_{DD}$ is supplied and the power potential $LV_{DD}$ is not supplied, the through current in the level shift circuit 31 can be prevented.

In contrast, the drain of the transistor QN53 is coupled to the second input terminal (the node B) of a level shift circuit 32, and the source is coupled to the reference potential $V_{SS}$. Further, the drain of the transistor QN54 is coupled to the second output terminal (the node D) of the level shift circuit 32, and the source is coupled to the reference potential $V_{SS}$.

Accordingly, when the power potential $HV_{DD}$ is supplied and the power potential $LV_{DD}$ is not supplied, the transistor QN53 fixes the potential of the second input terminal (the node B) of the level shift circuit 32 at low level, while the transistor QN54 fixes the potential of the second output terminal (the node D) at low level.

When the potentials of the nodes B and D of the level shift circuit 32 become low level, the transistors QP4 and QP2 shown in FIG. 1 become the on state, and the transistor QN2 becomes the off state. Further, the potential of the node C becomes high level, and the transistor QN3 is cut off. Accordingly, when the power potential $HV_{DD}$ is supplied and the power potential $LV_{DD}$ is not supplied, the through current in the level shift circuit 32 can be prevented.

Moreover, because the input potential of the inverter 41 is fixed at low level and the input potential of the inverter 42 is fixed at high level, the through current at the inverters 41 and 42 can be prevented. Further, as of the output driver 60, because the gate of the transistor 60 is fixed at high level and the gate of the transistor 62 is fixed at low level, the through current can be prevented by turning off both of the transistors 61 and 62 constituting the output driver 60.

What is claimed is:

1. A semiconductor integrated circuit that operates by receiving a plurality of power potentials including a first power potential and a second power potential higher than the first power potential, comprising:

an internal circuit that operates by receiving of the first power potential;

an inverter that inverts an output signal of the internal circuit by receiving of the first power potential;

a level shift circuit, which inputs the output signal of the internal circuit into a first input terminal while inputting an output signal of the inverter into a second input terminal, which generates a level shift signal whose ski nal level has been shifted from the output signal of the internal circuit at one of a first output terminal and a second output terminal by receiving the second power potential, and which outputs the level shift signal from one terminal among the first output terminal and the second output terminals;

an output circuit that operates by receiving of the second power potential, the output circuit operating based on the level shift signal output from the level shift circuit; and a potential fixing circuit that fixes potentials of the first input terminal and the second input terminal or potentials of one of the first input terminal and the second input terminal and one of the first output terminal and the second output terminal of the level shift circuit when the second power potential is supplied and the first power potential is not supplied.

2. The semiconductor integrated circuit according to claim 1, wherein:
the level shift circuit includes:
a first P-channel MOS transistor and a first N-channel MOS transistor connected in series, whose gates receive an output signal of the internal circuit;
a second P-channel MOS transistor and a second N-channel MOS transistor connected in series, whose gates receive an output signal of the inverter;
a third P-channel MOS transistor that supplies current to the first P-channel MOS transistor and the first N-channel MOS transistor; and
a fourth P-channel MOS transistor that supplies current to the second P-channel MOS transistor and a second N-channel MOS transistor.

3. The semiconductor integrated circuit according to claim 2, wherein:
the potential fixing circuit fixes gate potentials of the first P-channel MOS transistor and the first N-channel MOS transistor at low level and fixes drain potentials of the second P-channel MOS transistor and the second N-channel MOS transistor at low level when the second power potential is supplied and the first power potential is not supplied.

4. The semiconductor integrated circuit according to claim 2, wherein the potential fixing circuit fixes gate potentials of the second P-channel MOS transistor and the second N-channel MOS transistor at low level and fixes drain potentials of the first P-channel MOS transistor and the first N-channel MOS transistor at low level when the second power potential is supplied and the first power potential is not supplied.

5. A semiconductor integrated circuit that operates by receiving a plurality of power potentials including a first power potential and a second power potential higher than the first power potential, comprising:
an internal circuit that operates by receiving the first power potential;
a first level shift circuit, which inputs an output signal of the internal circuit into a first input terminal while inputting an inverted output signal into a second input terminal, which generates a first level shift signal whose signal level has been shifted from the output signal of the internal circuit at one of a first output terminal and a second output terminal, by receiving the second power potential, and which outputs the first level shift signal from one of the first terminal and the second output terminal;
a second level shift circuit, which inputs an output signal of the internal circuit into a third input terminal while inputting an inverted output signal into a fourth input terminal, which generates a second level shift signal whose signal level has been shifted from the output signal of the internal circuit at one of a third output terminal and a fourth output terminal, by receiving the second power potential, and which outputs the second level shift signal from one terminal among the third output terminal and the fourth output terminal;
an output driver including a P-channel MOS transistor and an N-channel MOS transistor connected in series, by receiving a second power potential, the outout driver generating an output signal based on the level shift signal output from each of the first level shift circuit and second level shift circuit; and
a potential fixing circuit that fixes potentials of the first input terminal and the second input terminal or potentials of one of the first input terminal and the second input terminals and one of the first output terminal and the second output terminal of the first level shift circuit and potentials of the third input terminal and the fourth input terminal or potentials of one of the third input terminal and the fourth input terminal and one of the third output terminal and the fourth output terminal of the second level shift circuits when the second power potential is supplied and the first power potential is not supplied.

6. A semiconductor integrated circuit that operates by receiving a plurality of power potentials including a first power potential and a second power potential higher than the first power potential, comprising:
an internal circuit that operates by receiving the first power potential;
an inverter that inverts an output signal of the internal circuit by receiving the first power potential;
a level shift circuit, which inputs the output signal of the internal circuit into a first input terminal while inputting the output signal of the inverter into a second input terminal, which generates a level shift signal whose signal level has been shifted from the output signal of the internal circuit at one of a first output terminal and a second output terminal, by receiving the second power potential, and which outputs the level shift signal from one of the first output terminal and the second output terminal, wherein the level shift circuit includes:
a first P-channel MOS transistor and a first N-channel MOS transistor connected in series, whose gates receive an output signal of the internal circuit;
a second P-channel MOS transistor and a second N-channel MOS transistor connected in series, whose gates receive an output signal of the inverter;
a third P-channel MOS transistor that supplies current to the first P-channel MOS transistor and the first N-channel MOS transistor; and
a fourth P-channel MOS transistor that supplies current to the second P-channel MOS transistor and a second N-channel MOS transistor;
an output circuit that operates by receiving the second power potential, the output circuit operating based on the level shift signal output from the level shift circuit; and
a potential fixing circuit that fixes potentials of the first input terminal and the second input terminal or potentials of one of the first input terminal and the second input terminals and one of the first output terminal and the second output terminal of the level shift circuit when the second power potential is supplied and the first power potential is not supplied, wherein the potential fixing circuit fixes gate potentials of the first P-channel MOS transistor and the first N- channel MOS transistor at low level and fixes drain potentials of the second P-channel MOS transistor and the second N-channel MOS transistor at low level when the second power potential is supplied and the first power potential is not supplied.

7. A semiconductor integrated circuit that operates by receiving a plurality of power potentials including a first power potential and a second power potential higher than the first power potential, comprising:
an internal circuit that operates by receiving the first power potential;
an inverter that inverts an output signal of the internal circuit by receiving the first power potential;
a level shift circuit, which inputs the output signal of the internal circuit into a first input terminal while inputting the output signal of the inverter into a second input terminal, which generates a level shift signal whose signal level has been shifted from the output signal of the internal circuit at one of a first output terminal and a second output terminal by receiving the second power potential, and which outputs the level shift signal from one terminal among the first output terminal and the second output terminal, wherein the level shift circuit includes:
- a first P-channel MOS transistor and a first N-channel MOS transistor connected in series, whose gates receive an output signal of the internal circuit;
- a second P-channel MOS transistor and a second N-channel MOS transistor connected in series, whose gates receive an output signal of the inverter;
- a third P-channel MOS transistor that supplies current to the first P-channel MOS transistor and the first N-channel MOS transistor; and
- a fourth P-channel MOS transistor that supplies current to the second P-channel MOS transistor and a second N-channel MOS transistor;

an output circuit that operates by receiving the second power potential, the output circuit operating based on the level shift signal output from the level shift circuit; and a potential fixing circuit that fixes potentials of the first input terminal and second input terminal or potentials in one of the first input terminal and second input terminal and one of the first output terminal and the second output terminal of the level shift circuit when the second power potential is supplied and the first power potential is not supplied, wherein the potential fixing circuit fixes gate potentials of the first P-channel MOS transistor and the first N- channel MOS transistor at low level and fixes drain potentials of the second P-channel MOS transistor and the second N-channel MOS transistor at low level when the second power potential is supplied and the first power potential is not supplied.

8. The semiconductor integrated circuit of claim 7 wherein the potential fixing circuit fixes gate potentials of the first P-channel MOS transistor and the first N-channel MOS transistor at low level and fixes drain potentials of the second P-channel MOS transistor and the second N-channel MOS transistor at low level when the second power potential is supplied and the first power potential is not supplied.

9. A semiconductor integrated circuit comprising:
- a level shift circuit including a first input terminal, a second input terminal, a first output terminal, and a second output terminal; and
- a potential fixing circuit that fixes a potential of the first input terminal or the first output terminal,
- a first signal being input to the first input terminal, an amplitude of the first signal being a first signal level,
- a second signal being input to the second input terminal, an amplitude of the second signal being the first signal level,
- a third signal being output from the first output terminal, an amplitude of the third signal being a second signal level,
- a fourth signal being output from the second output terminal, an amplitude of the fourth signal being the second signal level,
- the potential fixing circuit including a power on control circuit, a first switch, and a second switch,
- the power on control circuit outputting a power on control signal, the power on control signal controlling operations of the first switch and the second switch,
- the first switch being electrically connected to the first input terminal, and
- the second switch being electrically connected to the first output terminal.

* * * * *